US011009906B1

(12) United States Patent
Justin et al.

(10) Patent No.: US 11,009,906 B1
(45) Date of Patent: May 18, 2021

(54) INFORMATION HANDLING SYSTEM DISPLAY ADAPTIVE MAGNETIC SOUND BAR ATTACHMENT

(71) Applicant: Dell Products L.P., Round Rock, TX (US)

(72) Inventors: Wong Hin Loong Justin, Singapore (SG); Boon Kwang Koh, Singapore (SG)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/864,586

(22) Filed: May 1, 2020

(51) Int. Cl.
  *G06F 1/16* (2006.01)
  *H05K 5/02* (2006.01)
  *H04R 1/02* (2006.01)

(52) U.S. Cl.
  CPC .......... *G06F 1/1605* (2013.01); *H04R 1/025* (2013.01); *H04R 1/026* (2013.01); *H05K 5/0204* (2013.01); *G06F 2200/1612* (2013.01); *H04R 2499/15* (2013.01)

(58) Field of Classification Search
  CPC combination set(s) only.
  See application file for complete search history.

(56) References Cited

U.S. PATENT DOCUMENTS 9,182,068 B2 * 11/2015 Yamamoto ........ G02F 1/133308
9,581,284 B2 * 2/2017 Shin ....................... F16M 11/22
9,923,290 B2    3/2018 Gao et al.
10,375,346 B2 * 8/2019 Kaplan ................... A47B 81/06
10,490,933 B2   11/2019 Rohrbach et al.
10,893,364 B2 * 1/2021 Liniado ................... H04S 3/008
2010/0104124 A1 * 4/2010 Abraham ............... H04R 1/028
                                                              381/333
2012/0308065 A1 * 12/2012 Padalino .................. H04R 5/02
                                                              381/335
2014/0355805 A1 * 12/2014 Park ....................... H04R 1/026
                                                              381/333
2017/0127145 A1 * 5/2017 Rajapakse ........ H04N 21/85406
2017/0177039 A1 * 6/2017 Ent ........................ G06F 1/1626
2017/0354054 A1 * 12/2017 Kaplan .................. H04N 5/642
2018/0112819 A1 * 4/2018 Kim ........................ F16M 13/02
2018/0184182 A1 * 6/2018 Hong ..................... H04R 1/2803
2019/0018205 A1 * 1/2019 Lee ...................... G02B 6/3869
2019/0166419 A1 * 5/2019 Ko ....................... H04R 1/2803

(Continued)

OTHER PUBLICATIONS

Dell USA, "Dell Pro Stereo Soundbar—AE515M (Skype for Business certified)," downloaded Aug. 13, 2020, 4 pages.

*Primary Examiner* — Lisa Lea-Edmonds
(74) *Attorney, Agent, or Firm* — Zagorin Cave LLP; Robert W. Holland

(57) ABSTRACT

An information handling system display couples a sound bar to a bottom portion with magnetic connectors of the sound bar coupled to ferromagnetic material pieces disposed in the display bottom portion. A fixed position magnetic connector at one end of the sound bar couples in a static manner to an associated ferromagnetic material piece. An adaptive magnetic position connector at an opposite end of the sound bar couples in a dynamic manner to an associated ferromagnetic piece with motion in all three dimensions so that both magnetic position connectors have a minimal gap with adjustments to the relative orientation of the display and sound bar by the adaptive magnetic position connector.

20 Claims, 16 Drawing Sheets

(56) References Cited

U.S. PATENT DOCUMENTS

| | | | |
|---|---|---|---|
| 2020/0221217 A1* | 7/2020 | Kim | H04R 1/025 |
| 2020/0412176 A1* | 12/2020 | Choi | H02J 50/50 |
| 2021/0021896 A1* | 1/2021 | Cooper | H04N 21/23439 |

* cited by examiner

INFORMATION HANDLING SYSTEM DISPLAY ADAPTIVE MAGNETIC SOUND BAR ATTACHMENT

BACKGROUND OF THE INVENTION

Field of the Invention

The present invention relates in general to the field of information handling system displays, and more particularly to an information handling system display adaptive magnetic sound bar attachment.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems process information typically with a goal of presenting the information as visual images at a display. Desktop information handling systems will often support presentation of visual images at multiple displays simultaneously so that end users can fully leverage available processing capabilities of the information handling system, such as by executing multiple applications that each present visual images in window at the displays. One difficulty with the use of multiple displays at a desktop is that the displays can consume a considerable footprint on a desktop. In addition, end users tend to prefer large display viewing areas so that displays can become heavy and awkward to move. Generally end users prefer light weight flat panel displays with minimalist housings so that arrangement of displays on a desktop is more convenient. Often this minimalist housing approach involves an industrial design having a "zero" bezel in which the housing around the perimeter of the display panel has a minimal width so that the display panel appears to extend to the perimeter of the viewing area.

One difficulty with the use of displays that have large viewing areas and small bezels is that the displays tend to lack sufficient room for integrated speakers. Instead, speakers are added as a sound bar, typically with a separate speaker housing coupled to the bottom of the display bezel. For instance, a mechanical hook extending up from the sound bar upper housing surface inserts into an opening of the bezel lower surface to slide overlapping surfaces that secure the sound bar to the display. One difficulty with this approach is that displays with minimalist thickness do not have sufficient structure to include slots that will support the weight of a sound bar in a robust manner. Another difficulty is that end users often cannot figure out which way to slide the locking hook when coupling and detaching the sound bar. Further, sound bars can run along the entire length of the lower housing so that multiple connectors are needed. Coupling a sound bar with multiple small connectors under a display housing is an awkward process due to the position of the display bottom surface close to the desktop. Generally, an end user will have difficulty looking at the lower surface of the display bezel to locate the connection slots and to fit sound bar hooks into the slots without tipping over the display. Another option available to address these difficulties is to use magnetic attraction to couple the sound bar to the display bezel bottom surface, such as with magnets integrated in the sound bar that attract to magnets or ferromagnetic material. An advantage of this approach is that the magnets tend to pull the sound bar into place without an end user visually acquiring a connector location. A disadvantage is that magnetic attraction decreases as a function of the square of the distance between attractive elements so that magnets and opposing ferromagnetic material must have proximity to achieve sufficient attraction. Achieving accurate alignment of magnets and ferromagnetic material across the full bottom length of a large flat panel display is difficult and misalignment can leave gaps that impact the effectiveness of magnetic connectors. Such gaps can occur in all three dimensions at the magnetic coupling location. Although magnetic attraction can also be increased by including larger magnets, too great of an attraction can result in excessive force at the magnetic coupling, which can crack and break brittle magnetic material, such as Neodymium.

SUMMARY OF THE INVENTION

Therefore, a need has arisen for a system and method which provides effective magnetic attraction of a sound bar at a display bottom surface.

In accordance with the present invention, a system and method are provided which substantially reduce the disadvantages and problems associated with previous methods and systems to couple a sound bar to a display bottom surface. A sound bar couples to ferromagnetic material pieces disposed in the display with a fixed position magnetic connector having a static alignment and an adaptive position connector having a dynamic alignment that adjusts for misalignments of the display and sound bar for optimized magnetic attraction with minimal gaps between both of the magnetic connectors and the ferromagnetic material pieces.

More specifically, an information handling system display presents visual images at a display panel held over a support surface by a stand. Audio information associated with the visual information is presented by speakers integrated in a sound bar coupled to a bottom portion of the display with plural magnetic connectors. A fixed position magnetic connector couples at a first end of the sound bar to a first ferromagnetic material piece disposed in the display bottom portion in a static manner having a magnet of the fixed position magnetic connector in a fixed orientation plane relative to the sound bar. An adaptive position magnetic connector couples at a second opposing end of the sound bar to a second ferromagnetic material piece in a dynamic manner that allows a magnet orientation to adjust relative to the sound bar so that a planar minimal gap coupling to the display is accomplished. The adaptive position magnetic connector is biased to the plane of the fixed connector and dynamically adjusts from that static plane if needed to couple both connectors with zero gap between each of the magnets of the connectors and their associated ferromagnetic material pieces in the display. Dynamic three dimensional movement of the magnet translates misalignment of the sound bar relative to the display to the dynamic connector so that both the dynamic and static connectors achieve a minimal gap at coupling for optimal magnetic attraction.

The present invention provides a number of important technical advantages. One example of an important technical advantage is that magnetic connectors achieve minimal gap and thus optimal magnetic attraction by dynamic adjustment of one connector magnet to bring both connector magnets into full contact with ferromagnetic material pieces disposed in a display. Dynamic adjustment provides a minimal freedom of movement for three dimensions so that both the dynamic and the static magnetic connectors achieve full coupling with zero gap to each associated ferromagnetic material piece. Having only one connector provides dynamic orientation adjustments and reduces rattle or noises associated with audio play vibrations, such as a rattle of ferromagnetic material pieces within the display. Zero-gap magnetic coupling increases magnetic coupling force so that smaller and less powerful magnets may be used to achieve a desired magnetic attraction and reduces the size of the connectors for use in low profile displays and sound bars. Magnetic couplers simplify detachment of the sound bar from the display with rotational movement forward or behind the display and a pull down, as opposed to a sliding movement with conventional coupling devices. In addition, while attached by magnetic couplers the sound bar may have a range of orientations and locations based upon location of ferromagnetic material instead of narrow positioning associated with a slot lock or similar coupling device.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system display couples a sound bar to a lower housing surface with an adaptive magnetic connector. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
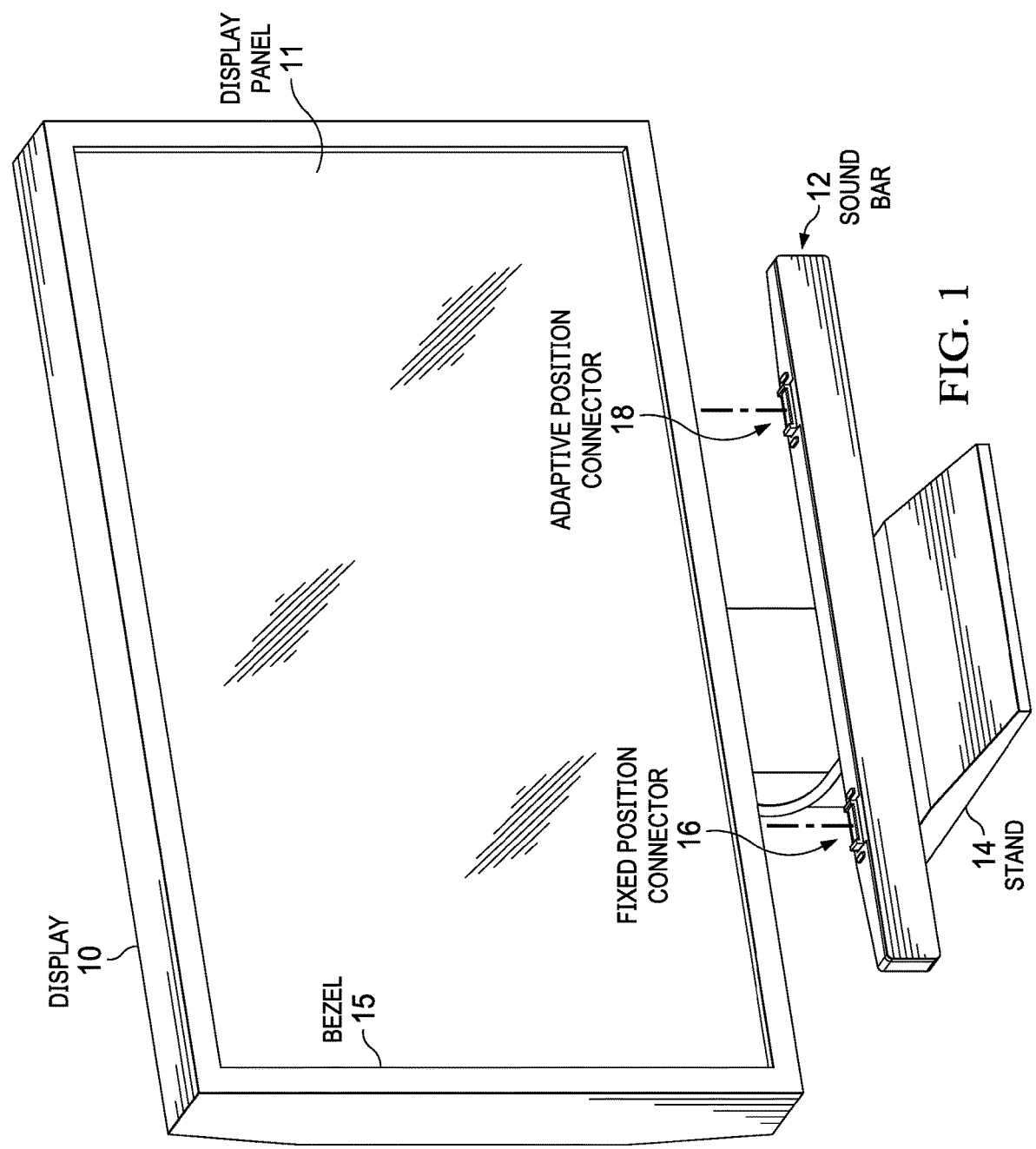
FIG. 1 depicts an information handling system display having a sound bar coupled to a lower surface with an adaptive magnetic connector.

Referring now to FIG. 1, an information handling system display 10 is depicted having a sound bar 12 coupled to a lower surface with an adaptive magnetic connector 18. In the example embodiment, display 10 presents visual images at a display panel 11, such as with pixel values generated by an information handling system and communicated through a display cable or other communication medium. For instance, display panel 11 is a liquid crystal display (LCD) panel or organic light emitting diode (OLED) display panel. In the example embodiment, display 10 is supported with a housing having a stand 14 and a bezel 15 that couples about the outer circumference of display panel 11. Sound bar 12 provides audio sound output with integrated speakers, such as audio associated with audiovisual information presented at display panel 11. In various embodiments, sound bar 12 may receive power and audio information with cable as depicted or may have a port interfaced with the lower surface of display 10.

Sound bar 12 couples to a bottom portion of display 10 by aligning first and second ferromagnetic material pieces integrated in the bottom portion with a fixed position magnetic connector 16 and an adaptive position magnetic connector 18 disposed at opposing ends of the upper surface of sound board 12. Fixed position connector 16 has a stationary attachment to sound bar 12 aligned to mate squarely against a ferromagnetic portion integrated in display 10 as sound bar 12 is raised in proximity to display 10. In contrast, adaptive position connector 18 couples to sound bar 12 at a fixed location that aligns with a display ferromagnetic material piece with a dynamic mount that adjusts the alignment of a planar surface of a magnet in adaptive position magnet connector 18 to help ensure a coupling having minimal gap between the magnet and ferromagnetic material piece. For instance, a dynamic mount couples the magnet to have rotational movement about all three axes relative to the display ferromagnetic material piece. As is described in greater depth below, adaptive position magnet connector 18 provides freedom of movement of the coupling magnet with a magnet housing having an arch support or with biasing devices that provide a flexible magnet alignment, such as springs and compression washers. Dynamic movement of one magnet allows both magnets to have a planar coupling to each magnet's associated ferromagnetic material piece to minimize gaps and maximize magnetic attraction.

Figure 2A:
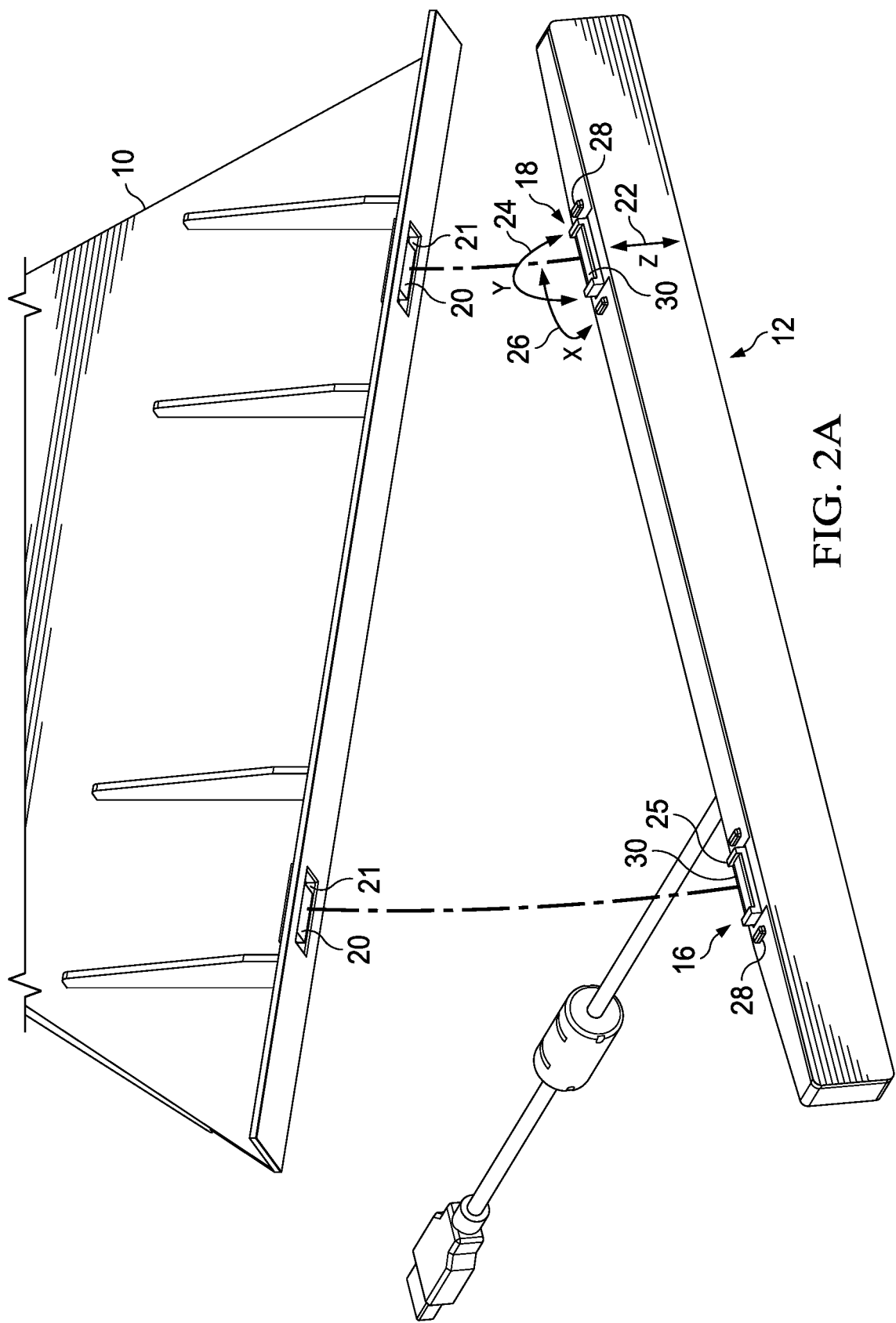
FIGS. 2A and 2B depict a bottom view of the display and upper view of the sound bar for alignment and coupling of sound bar magnetic connectors to ferromagnetic material pieces integrated in the display.
Figure 2B:
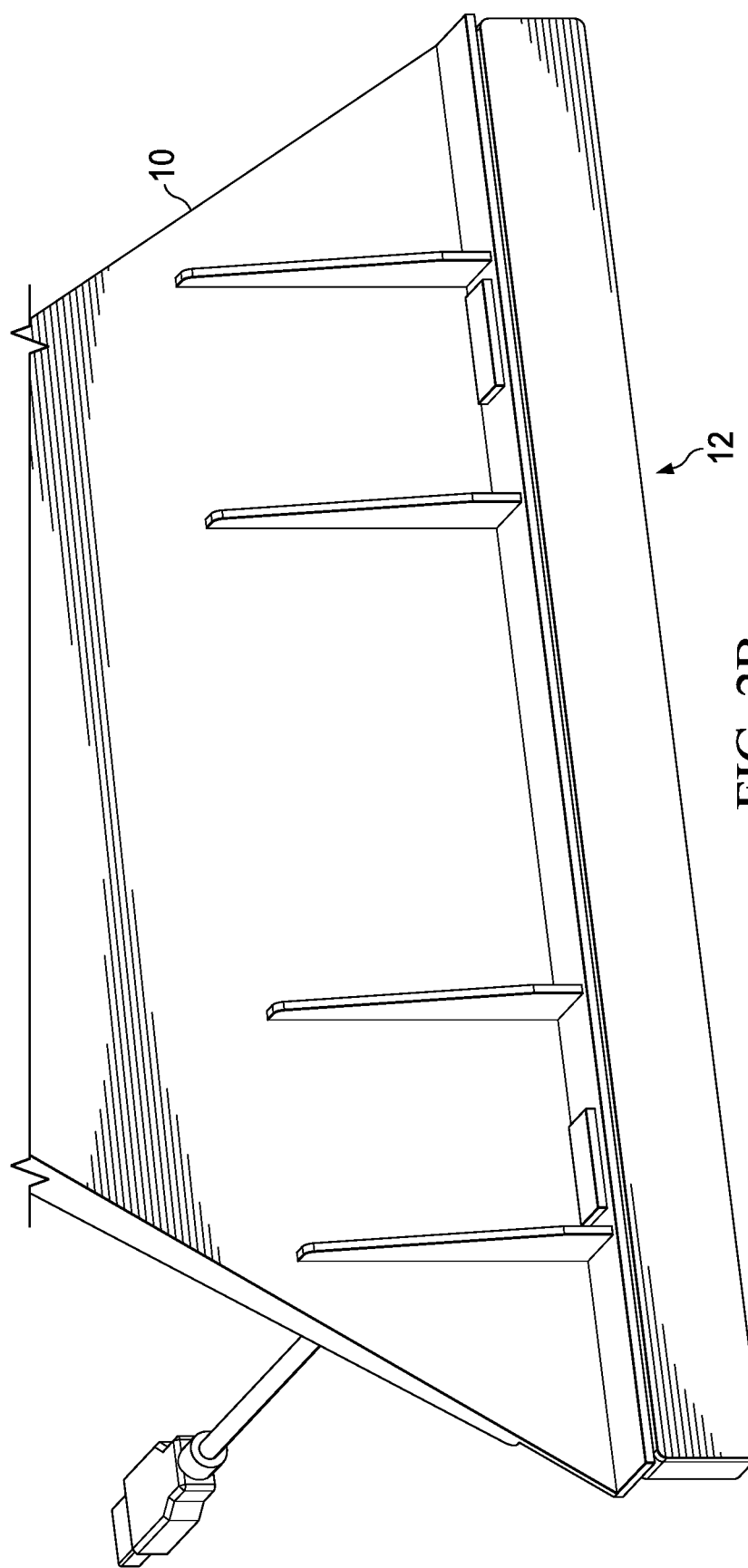

Referring now to FIGS. 2A and 2B, a bottom view of the display 10 and upper view of the sound bar 12 depict alignment and coupling of sound bar magnetic connectors 16 and 18 to ferromagnetic material pieces 20 integrated in the display bottom portion. Ferromagnetic material pieces 20 are, for instance, steel plates integrated in a bottom portion of display 10 with injection insert molding to provide tight dimensional tolerances for close contact between magnetic and ferromagnetic material. On each side of the ferromagnetic material piece, a dimple 21 is formed to accept a guide 25 associated with magnetic position connectors 16 and 18. Cushions 28, such as Poron damper pads, attach to sound bar 12 to contact display 10 and absorb vibrations at the contact zones, such as from audio vibrations associated with speaker operation. FIG. 2A depicts sound bar 12 aligned to couple to display 10 with guides 25 inserting in dimples 21 to bring magnets of magnetic position connectors 16 and 18 in close proximity with ferromagnetic material pieces 20 so that the magnetic attraction holds sound bar 12 in place against the bottom portion of display 10. In the example embodiment, ferromagnetic material pieces 20 are steel plates, although in alternative embodiments, magnets of other types of ferromagnetic materials may be used. Fixed position connector 16 has a magnet 30 held in a fixed position relative to sound bar 12 so that the magnet and ferromagnetic material work sound bar 12 to an absolute relative position to display 10. In contrast, adaptive magnetic connector 18 couples its magnet 30 to support movement about a Z axis 22, a Y axis 24 and an X axis 26. This freedom of movement has the effect of providing flat contact between the magnet and its associated ferromagnetic material piece for optimal magnetic coupling even where sound bar 12 is slightly off axis from the bottom portion of display 10. Having one fixed magnetic position connector and one adaptive magnetic position connector ensures that the magnets of both position connectors will have full planar contact with their respective associated ferromagnetic pieces since three dimensional motion at the adaptive connector compensates for misalignments at both magnetic connectors.

Figure 3:
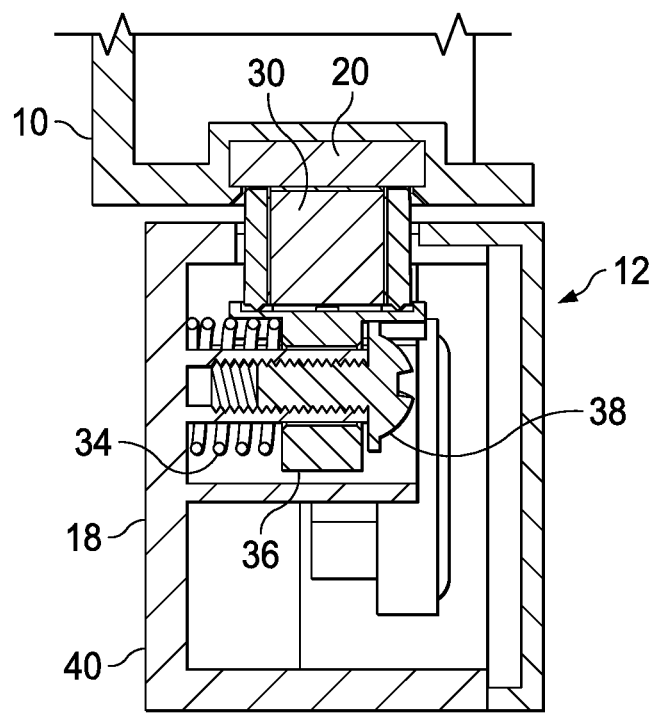
FIG. 3 depicts a side cutaway view of an example embodiment of the adaptive position magnetic connector coupled to a ferromagnetic material piece integrated in a display.

Referring now to FIG. 3, a side cutaway view depicts an example embodiment of adaptive position magnetic connector 18 coupled to a ferromagnetic material piece 20 integrated in a display 10. Cushion 28 is compressed between the bottom portion of display 10 and the upper surface of the housing 40 that contains magnet 30 to reduce vibration while permitting contact between magnet 30 and ferromagnetic piece 20. A magnet support 36 couples to magnet 30 and within adapter connector housing 40 with a screw 38 and spring 34 so that dynamic movement of magnet support 36 provides adjustments to magnet 30 relative to adapter connector housing 40 to maneuver magnet 30 in a planar parallel relationship with ferromagnetic material piece 20. The nature of three axis movements for magnet 30 are described in greater detail below.

Figure 4A:
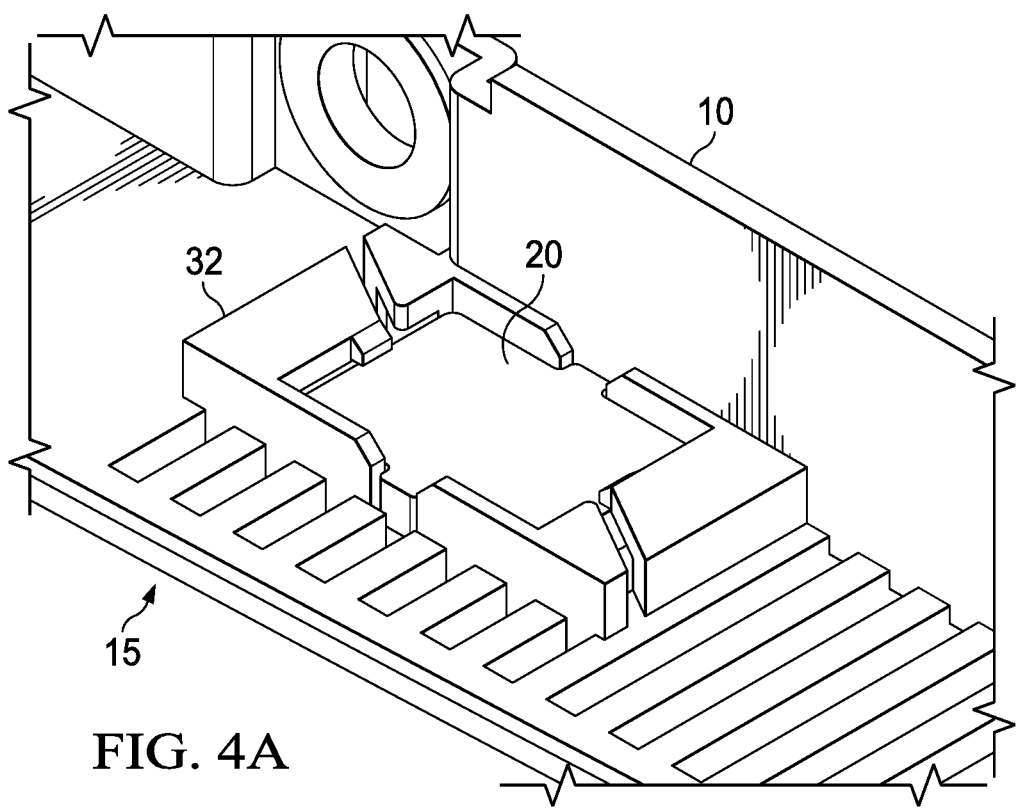
FIGS. 4A and 4B depict an alternative embodiment of a ferromagnetic material piece integration in a display.
Figure 4B:
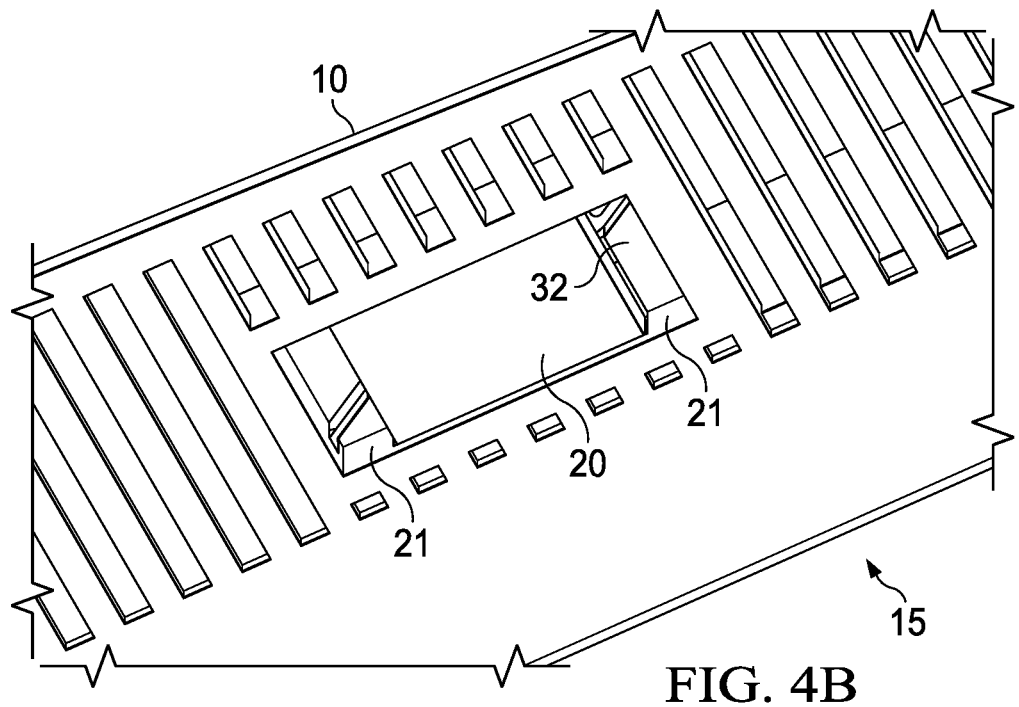

Referring now to FIGS. 4A and 4B, an alternative embodiment is depicted of a ferromagnetic material piece 20 integration in a display 10. Ferromagnetic material piece 20 is a steel plate that snaps into a snap feature 32 formed in the bottom portion of display 10. FIG. 4A depicts snap feature 32 and ferromagnetic piece 20 from an interior of display 10 at the bottom portion of the display, such as integrated in bezel 15. An advantage of the snap-in ferromagnetic material piece 20 is that recycling of the plastic is simplified at product end of life. Snap feature 32 captures the steel plate to prevent it from becoming loose within display 10, however, force applied by a magnet coupling the sound bar to display 10 pulls the steel plate firmly against the bottom portion of display 10 to provide a firm coupling support. FIG. 4B depicts the bottom portion of display 10 where ferromagnetic material piece 20 is exposed in a fixed position between dimples 21 that guide a magnetic connector into place. In the example embodiment, the steel plate is held slightly recessed into display 10 bottom portion, such as by 1.0 mm, so that a magnet of the sound bar extends upward to have direct contact with no gap and maximum magnetic attraction.

Figure 5A:
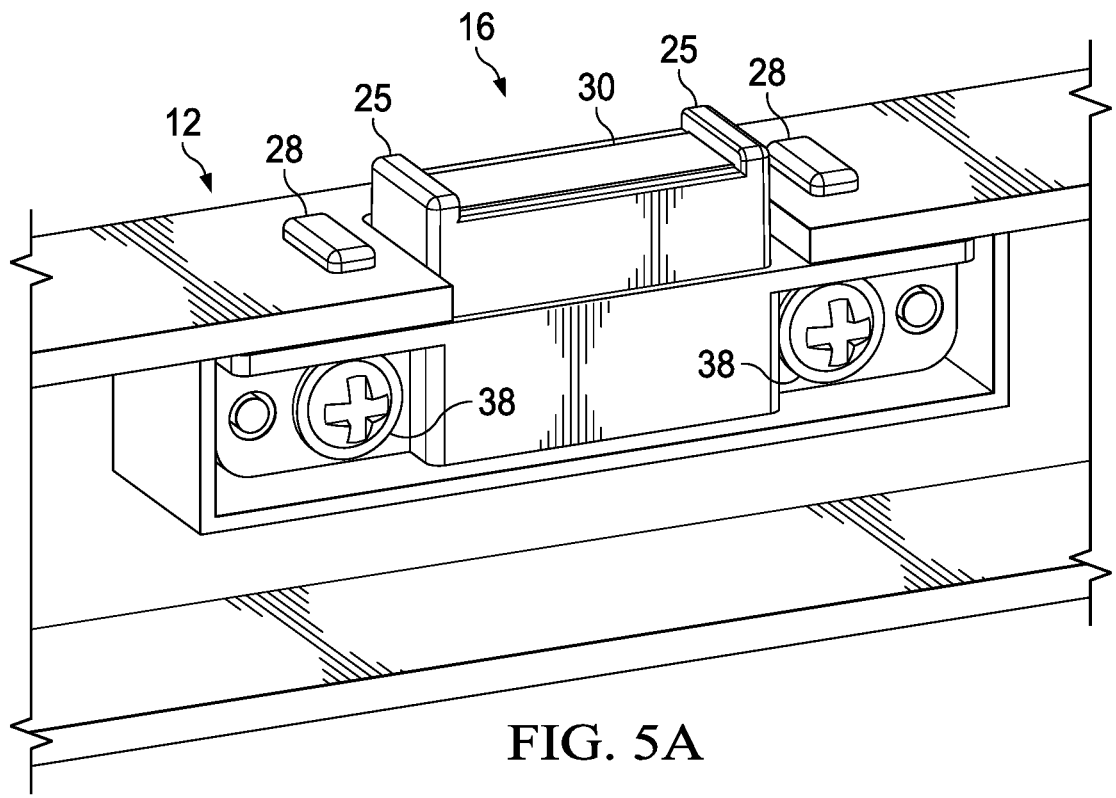
FIGS. 5A, 5B, 5C, 5D and 5E depict an example embodiment of fixed and adaptive position connectors that couple a sound bar to a display bottom portion.
Figure 5B:
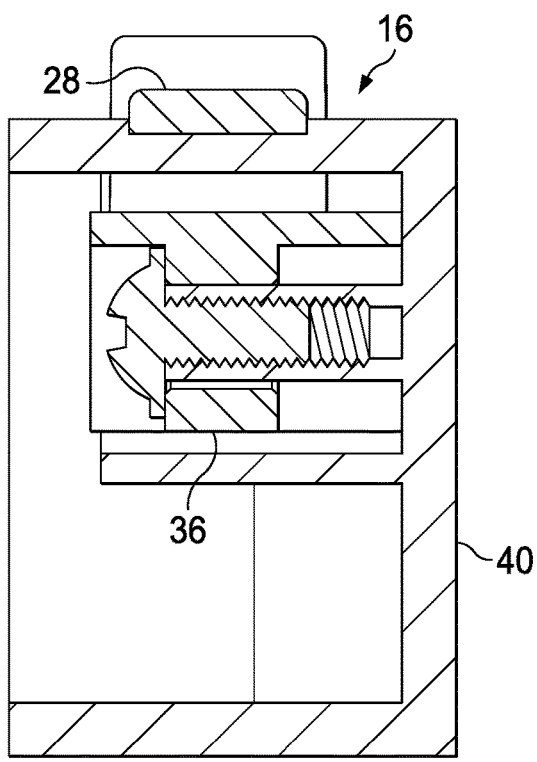
Figure 5D:
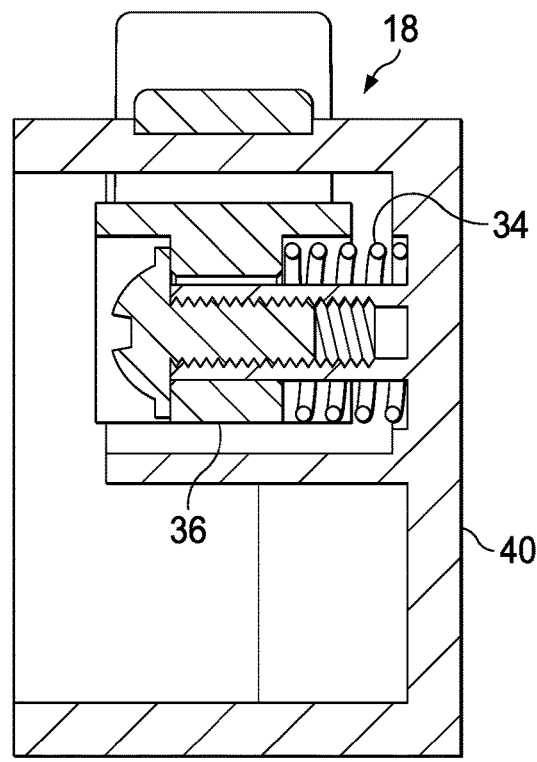
Figure 5C:
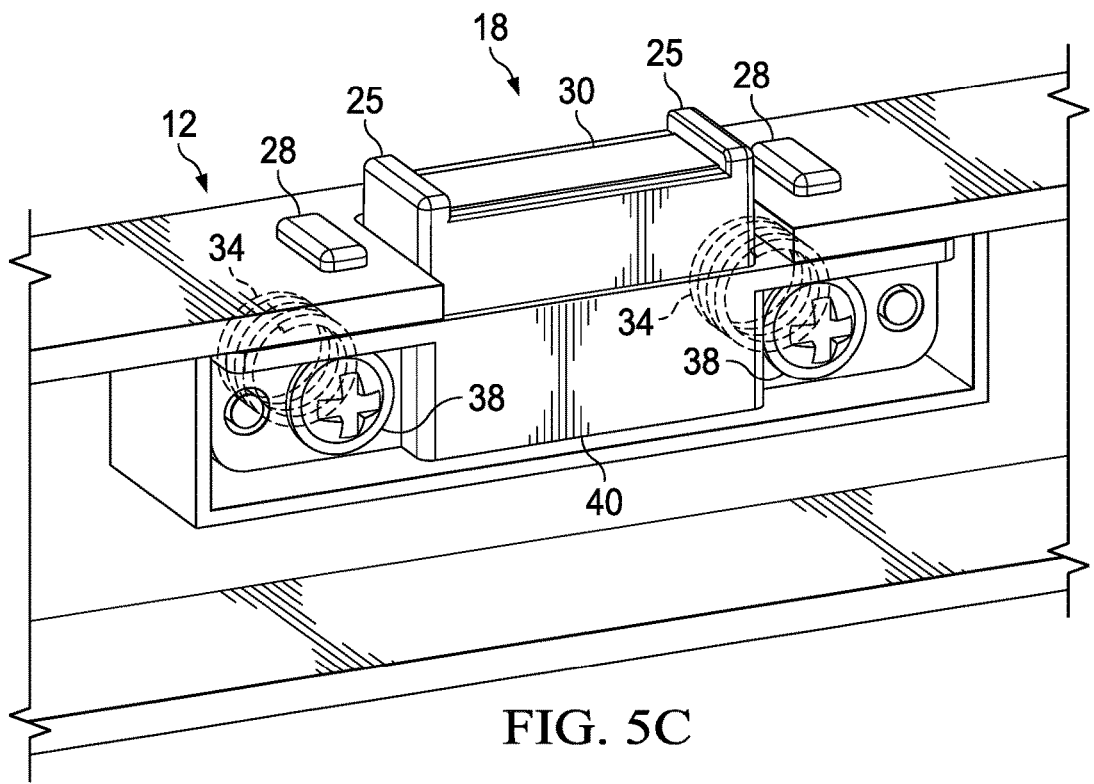

Referring now to FIGS. 5A, 5B, 5C, 5D and 5E, an example embodiment depicts fixed and adaptive position connectors 16 and 18 that couple a sound bar 12 to a display 10 bottom portion. FIG. 5A depicts a fixed position connector 16 having magnet 30 disposed in a connector housing 40 that is fixedly held in a static position by screws 38 inserted at opposing ends of connector housing 40 to hold connector housing 40 in a static position. Guides 25 extend up at each side of magnet 30 so that fixed position connector 16 inserts at a display bottom portion to squarely align magnet 30 with the ferromagnetic material piece in the display in a position that maximizes magnetic attraction without any gap between magnet 30 and the ferromagnetic material piece. In contrast, FIG. 5C depicts an adaptive position connector 18 that adjusts the position of magnet 30 relative to sound bar 12 so that magnet 30 can firmly couple to the ferromagnetic material piece while remaining misaligned relative to a neutral position with sound bar 12. To accomplish dynamic positioning of magnet 30 relative to sound bar 12 for a zero gap coupling to the ferromagnetic material piece, screws 38 couple to sound bar 12 inserted through a compression spring 34 to allow three dimension movement about the X, Y and Z axes. Screws 38 fit into screw bosses at opposite ends of magnet 30 to promote movement about vertical, horizontal and rotational axes. In the example embodiment, screws 38 are located outside the length of each side of magnet 30, however, in alternative embodiments screws 38 may couple under magnet 30. Guides 25 insert into dimples of the display to bring magnet 30 within proximity of the ferromagnetic material at a neutral orientation under the bias of springs 34 acting on connector housing 40 relative to a magnet support 36. As magnet 30 pulls towards the ferromagnetic material piece, the magnetic attraction forces work against bias of springs 34 so that a square coupling of the magnet and ferromagnetic piece surfaces maximizes magnetic attraction.

Figure 5E:
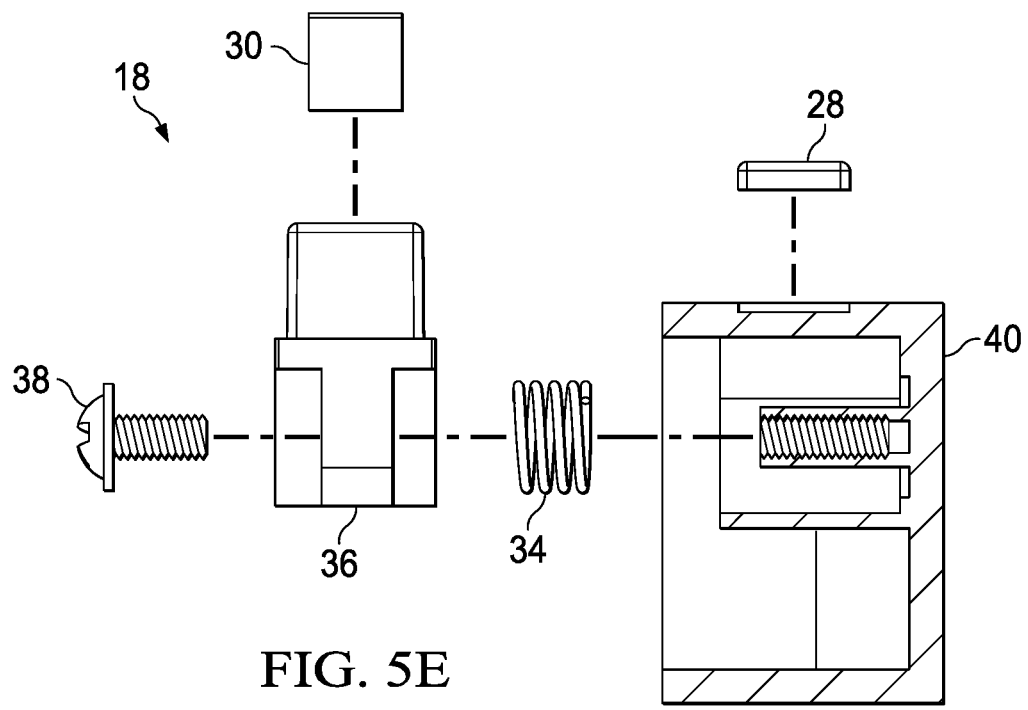

FIG. 5B depicts a cutaway view of fixed position connector 16 illustrating that screw 38 tightly couples magnet support 36 to a static position. In contrast, FIG. 5D depicts spring 34 inserted between adapter connector housing 40 and magnet support 36 to provide three dimensional flexibility of the magnet position relative to adapter connector housing 40. In the example embodiment, fixed position connector 16 screws 38 has screw boss locations slightly lower than the screw boss locations of adaptive position connector 18 so that screw 38 bites down to press magnet support 36 against adapter connector housing 40 for a static coupling. Screw bosses located slightly higher for adaptive position connector 18 provide room for magnet support 36 to move relative to adapted connector housing 40. FIG. 5E depicts an exploded view of adaptive position connector 18 illustrating insertion of spring 34 around the screw boss of adapter connector housing 40 and insertion of magnet support 36 around spring 34. In various embodiments, alternative arrangements of securing devices may be used to provide a secure but flexible coupling of magnet 30 to sound bar 12 to allow adaptive alignment of the magnet for a gap-free coupling to the display ferromagnetic material piece.

Figure 6A:
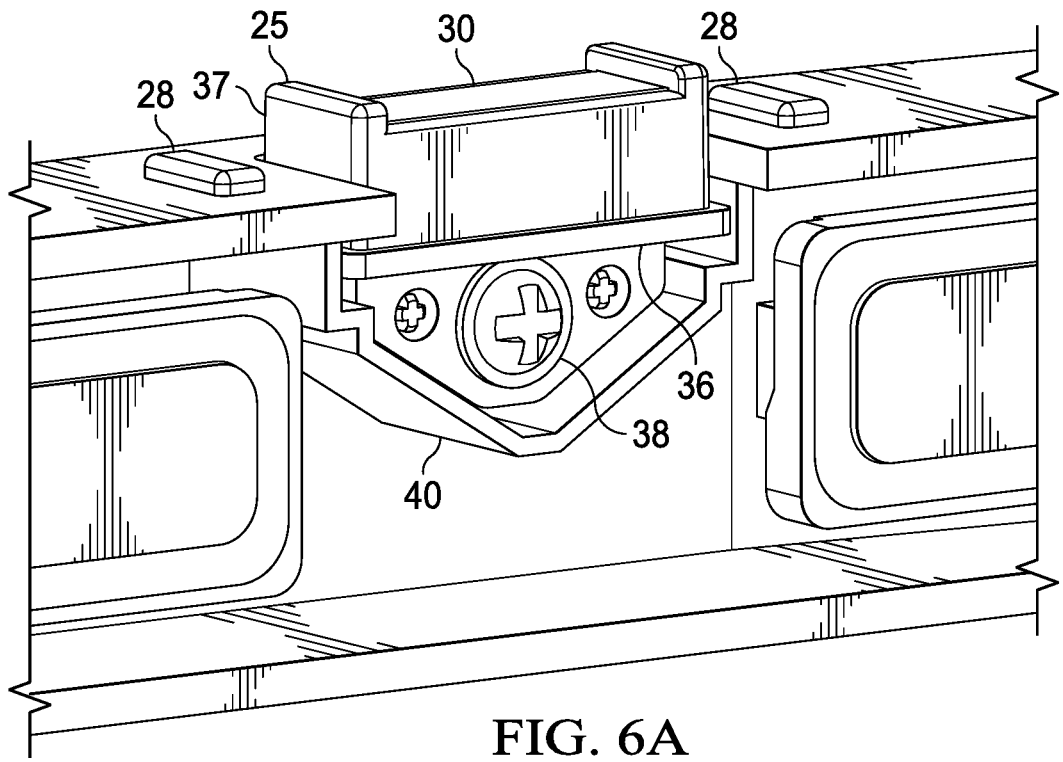
FIGS. 6A, 6B, 6C, 6D and 6E depict an alternative example embodiment fixed and adaptive position connectors and that couple a sound bar to a display bottom portion.
Figure 6B:
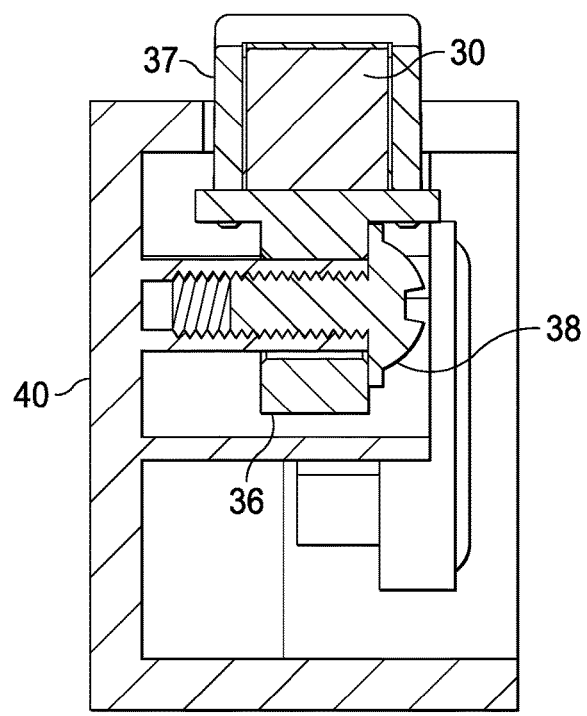
Figure 6D:
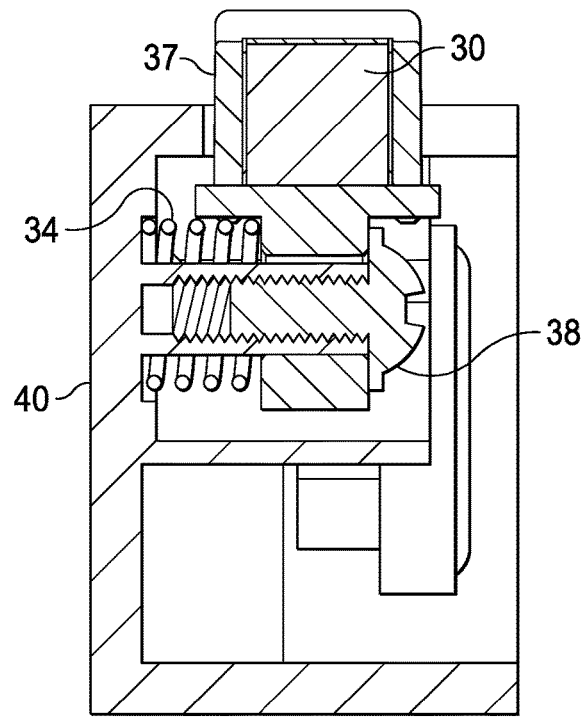
Figure 6C:
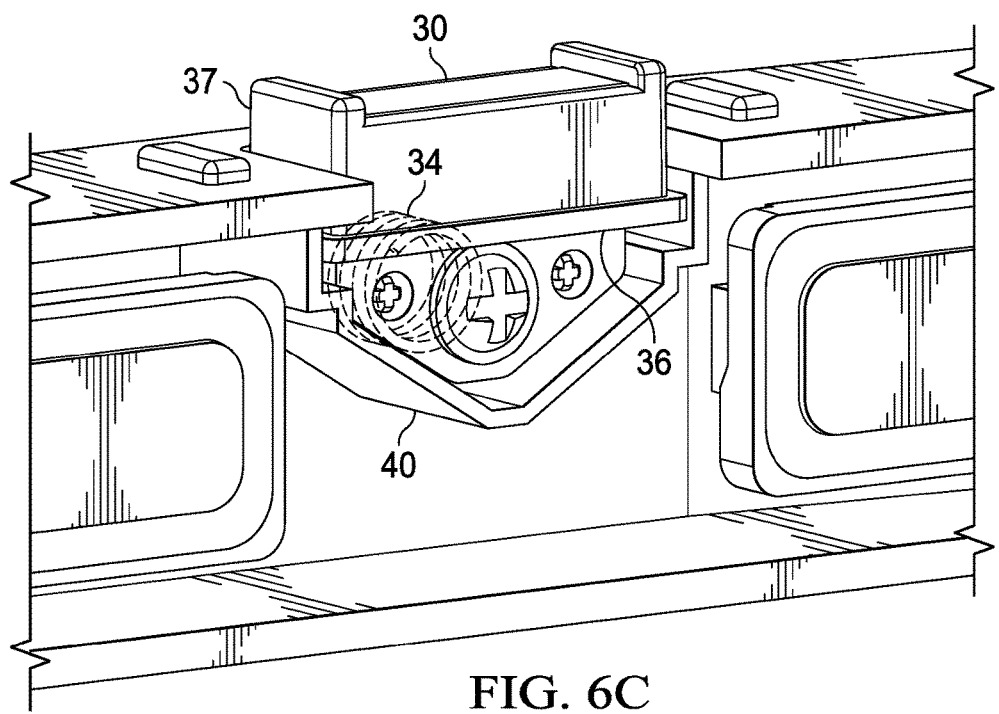
Figure 6E:
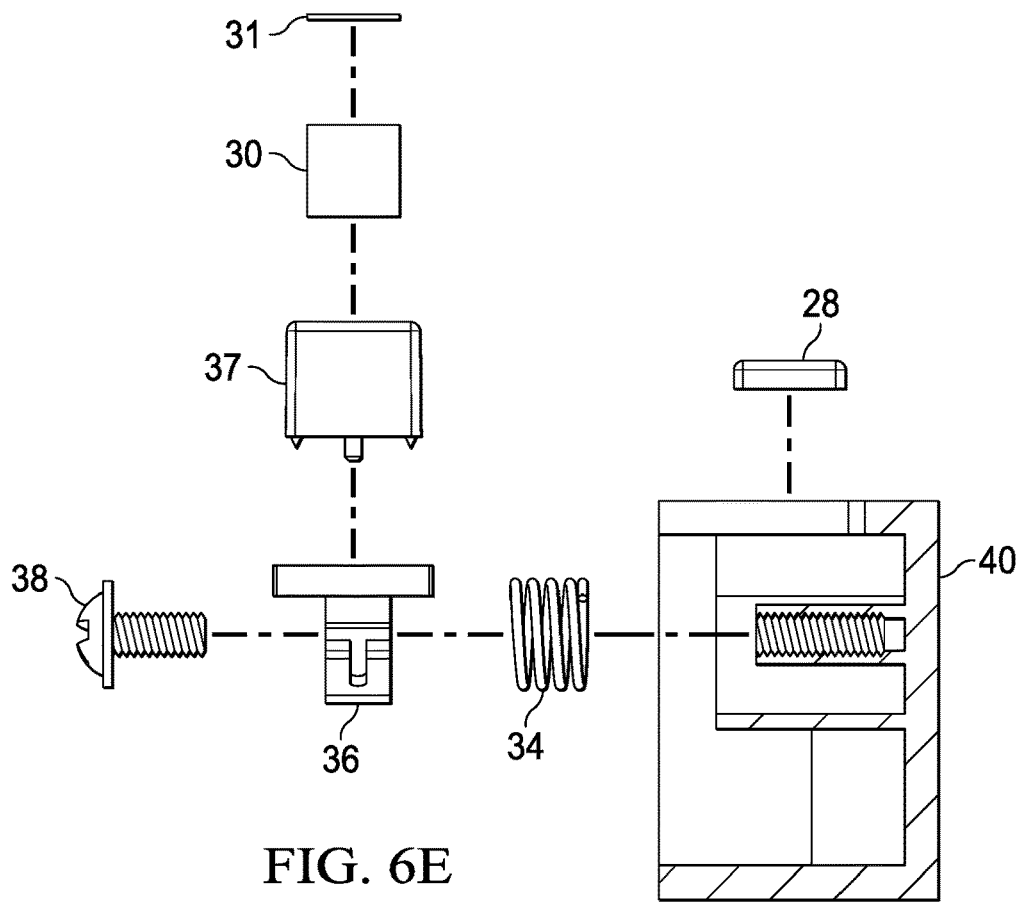

Referring now to FIGS. 6A, 6B, 6C, 6D and 6E, an alternative example embodiment depicts fixed and adaptive position connectors 16 and 18 that couple a sound bar 12 to a display 10 bottom portion. The example embodiment magnet support 36 has a triangular shape with a v-shaped bottom resting on a v-shaped base of adapter connector housing 40. FIGS. 6A and 6B depict fixed position connector 16 coupled in a static manner with screw 38 to hold magnet 30 in a fixed location. First and second openings formed in magnet support 36 on both sides of screw 38 accept stakes proceeding out of adapter connector housing 40 to aid assembly of the support and hold magnet support 36 in a fixed position. A single screw 38 secures magnet support 36 in position. FIGS. 6C and 6D depict adaptive position connector 18 having a spring 34 inserted over the screw boss of adapter connector housing 40 to permit three dimensional dynamic motion of magnet support 36 with limited rocking motion at the intersection of the v-shaped surfaces. The rocking motion is defined by the boss location as described with respect to FIG. 5. FIG. 6E depicts an exploded view of adaptive position connector 18 including a separated magnet housing 37 that holds magnet 30 over magnet support 36 as shown in greater detail by FIG. 7B described below.

Figure 7A:
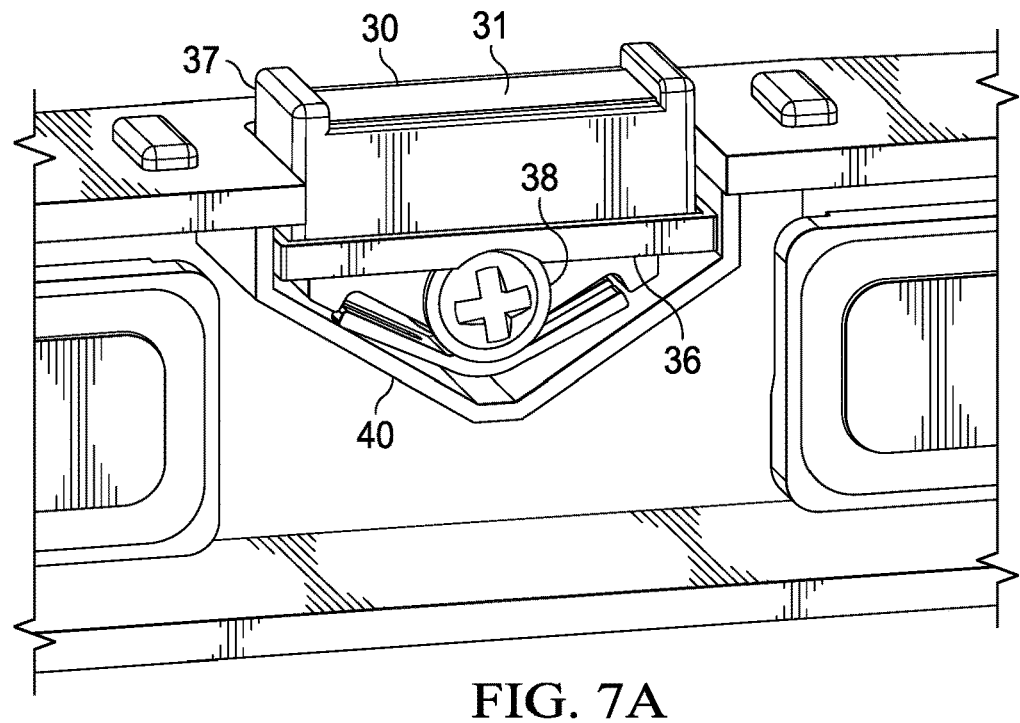
FIGS. 7A, 7B and 7C, an alternative example embodiment depicts an adaptive position connector having a flexible bottom surface of the magnet support.
Figure 7B:
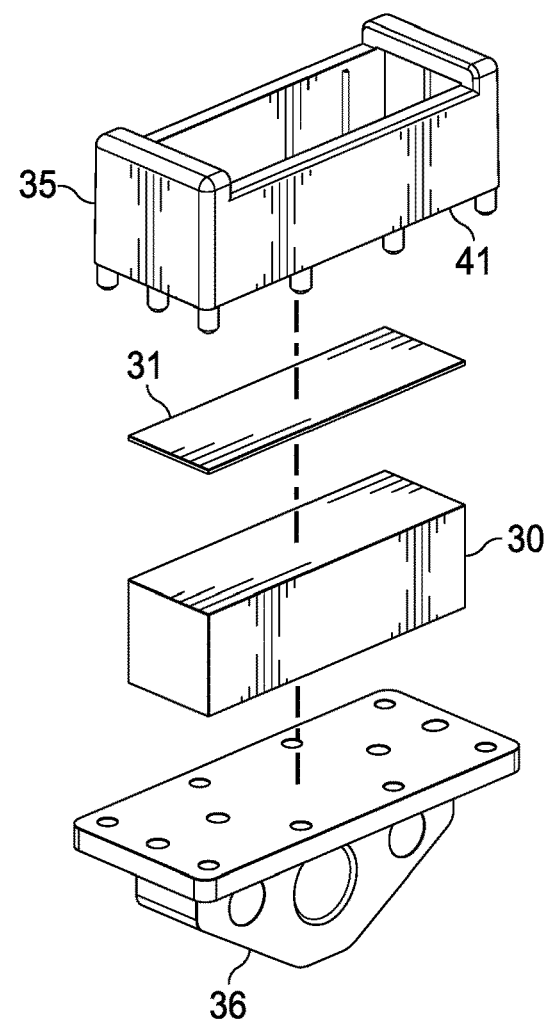
Figure 7C:
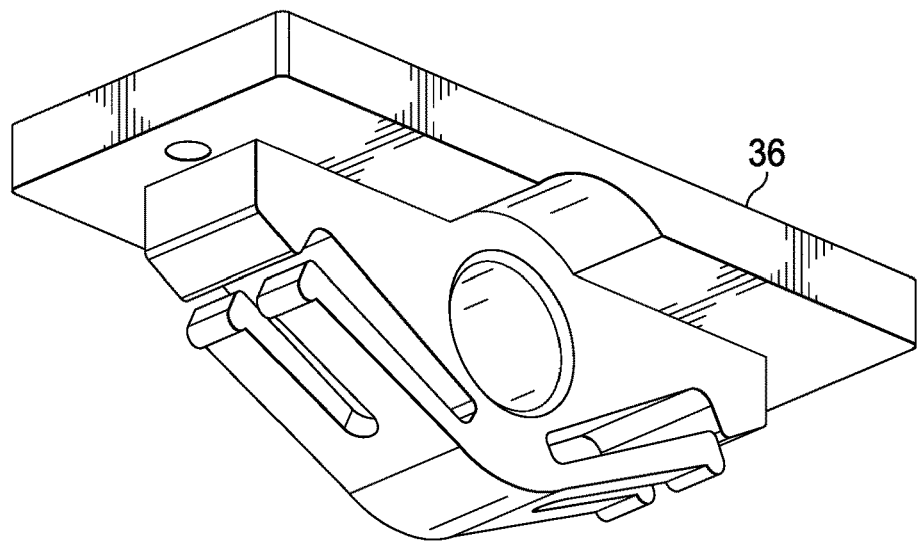

Referring now to FIGS. 7A, 7B and 7C, an alternative example embodiment depicts an adaptive position connector having a flexible bottom surface of the magnet support 36. FIG. 7A depicts adaptive position connector 18 integrated in a sound bar 12 with a screw 38 coupling magnet support 36 to an adapter connector housing 40 to dynamically hold magnet 30 relative to sound bar 12. Flexible members 37 formed the bottom v-shaped surface of magnet support 36 bias magnet 30 to a neutral position in a parallel plane with sound bar 12. A steel plate 31 rests over magnet 30 to protect brittle magnet material, such as N42 or n48 grade neodymium, from breaking due to impact. Steel plate 31 does somewhat reduce magnetic attraction and is thus used where a thin or brittle magnet is selected, whereas many magnets will have sufficient structural strength to avoid the use of steel plate 31. As magnet 30 experiences magnetic attraction due to proximity of a display ferromagnetic material piece, misalignment between magnet 30 and the ferromagnetic material piece is offset with movement of magnet support 36 relative to adapter connector housing 40, which is fixed in position relative to the sound bar. FIG. 7B depicts an exploded view of a fixed position connector 16 having a solid and nonflexible magnet support 36 to provide a static magnet position. Magnet support 36 couples to a magnet housing 35 that contains magnet 30 captured by a steel plate 31. Magnet housing 35 has stakes 41 on a bottom surface that insert into openings of magnet support 36 to couple by an adhesive or heat stake process. The fixed bottom surface of magnet support 36 holds magnet 30 in a static position relative to sound bar 12 by engaging with the v-shaped support of adapter connector housing 40. FIG. 7C depicts a bottom perspective view of a magnet support housing 36 for use in an adaptive position connector 18. Flexible members 37 form the v-shaped bottom to provide movement of magnet 30 by flexing against the v-shaped support of adapter connector housing 40. In the example embodiment, flexible members 37 extend up from the base of the V-shape to work against the sides of the connector housing for a rocking motion that adjusts magnet orientation. In an alternative embodiment, flexible members 37 may extend downwards from the upper side of magnet support 36 towards the V-shape base. Although the example embodiment depicts a v-shaped support between magnet support 36 and adapter connector housing 40, alternative embodiments may use other types of shape and relationships.

Figure 8A:
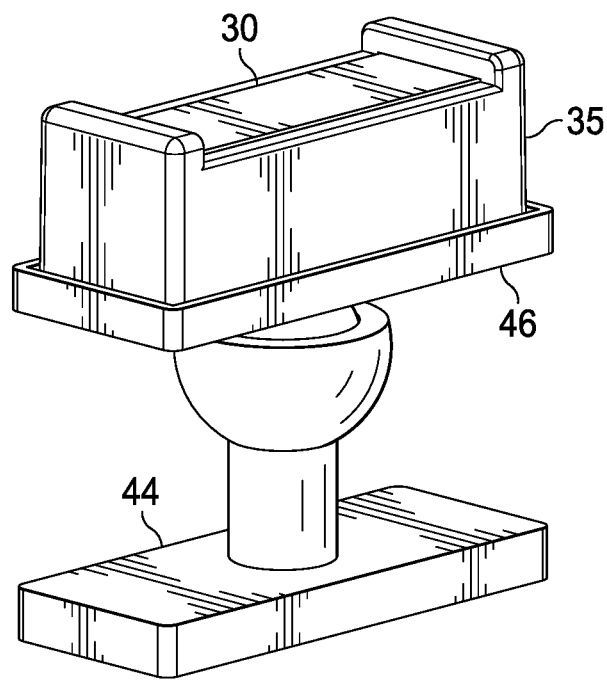
FIGS. 8A and 8B depict an alternative example embodiment of an adaptive position connector having a pivot coupling.
Figure 8B:
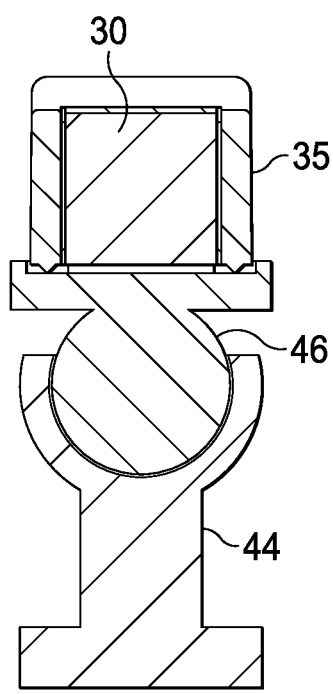

Referring now to FIGS. 8A and 8B, an alternative example embodiment depicts an adaptive position connector 18 having a pivot coupling. FIG. 8A depicts a side perspective view of the example adaptive position connector 18 having a cup base 44 that supports a ball support 46. The cup and ball support adjust a relative position of magnet 30 in magnet housing 35 to provide reduced gap at the coupling plane of magnet 30 to a ferrous material piece. FIG. 8B depicts a side cutaway view of ball support 46 engaged in cup support 44 to rotate in response to magnetic attraction forces when magnet 30 misaligns with a ferromagnetic material piece of a display. In various embodiments, constraints may be placed upon the movement of the ball relative to the cup, such as with a limiting structure or biasing devices. In one alternative embodiment, the ball may be incorporated in the base and the cup inverted in the magnet housing.

Figure 9A:
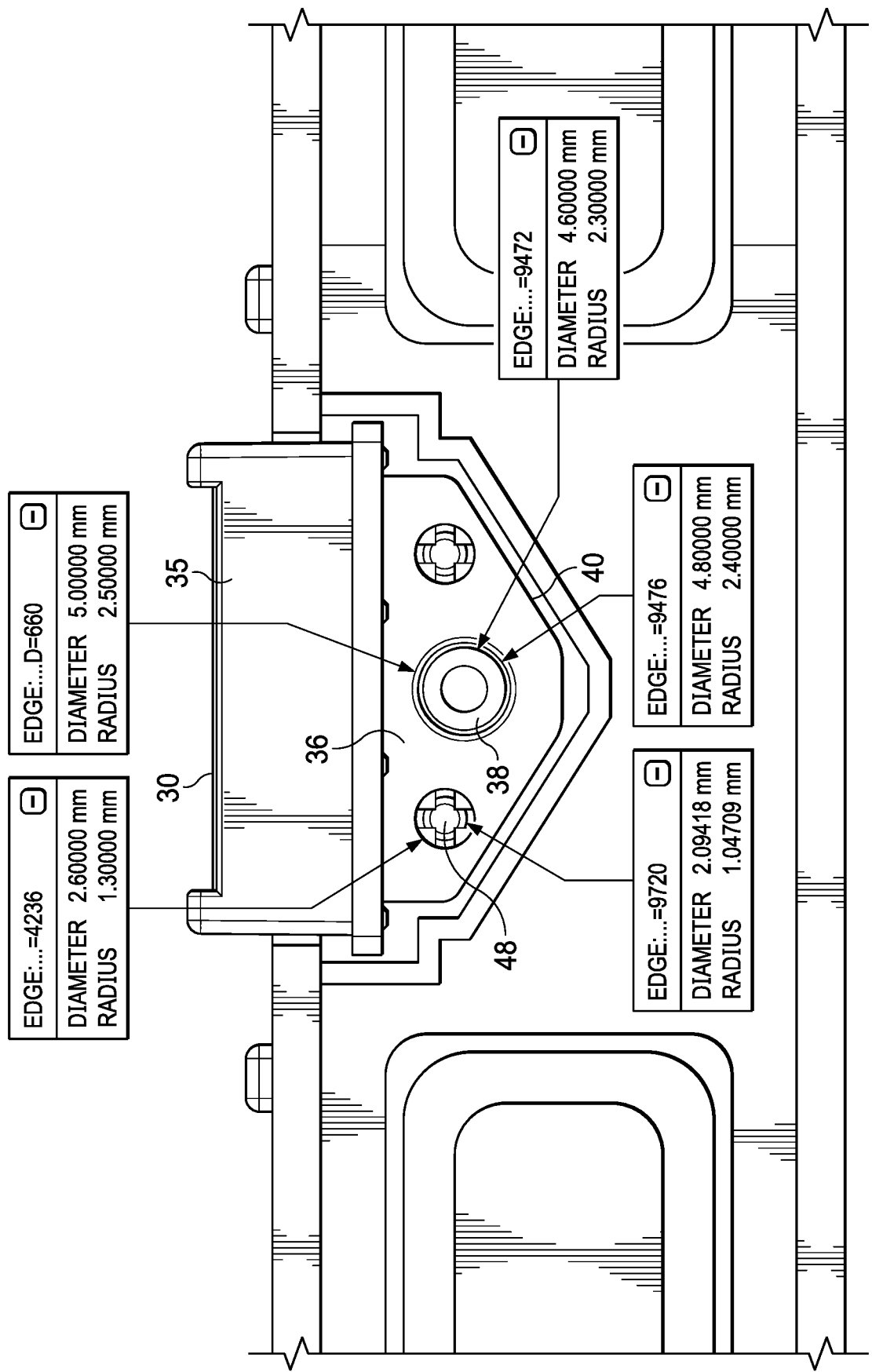
FIGS. 9A, 9B, 9C, 9D and 9E depict examples of three dimensional movement supported by an adaptive position connector to obtain a minimal gap coupling to a ferromagnetic material piece.
Figure 9B:
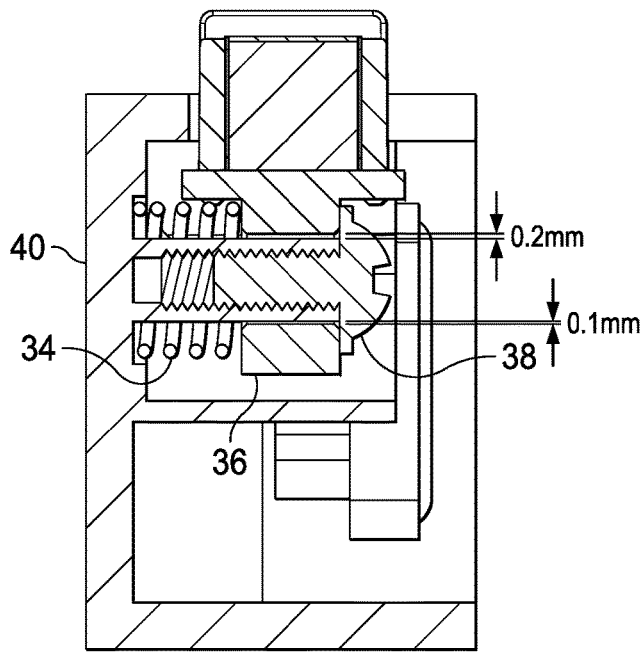
Figure 9C:
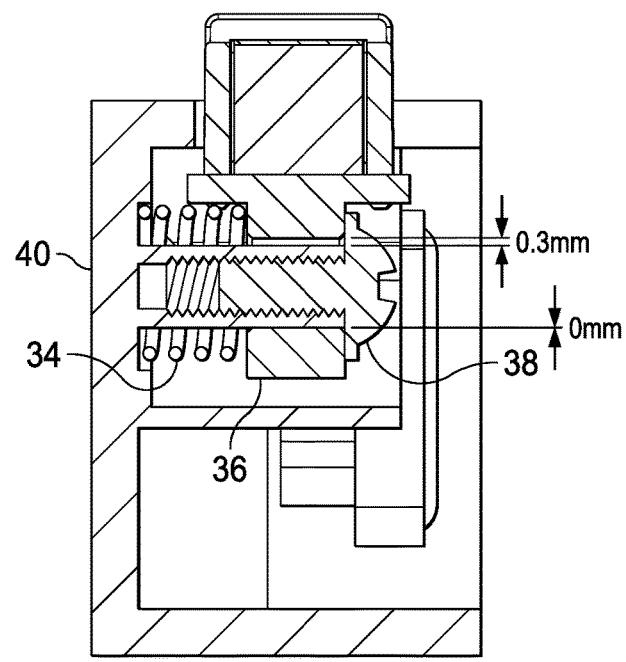
Figure 9D:
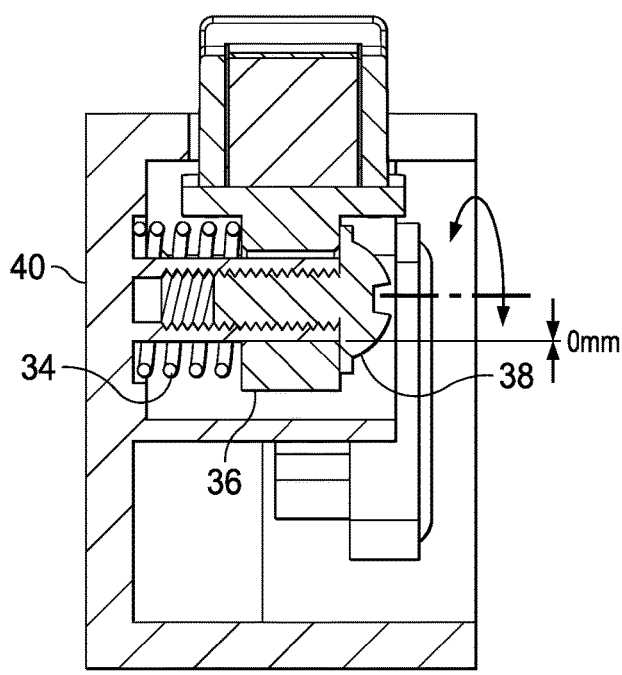
Figure 9E:
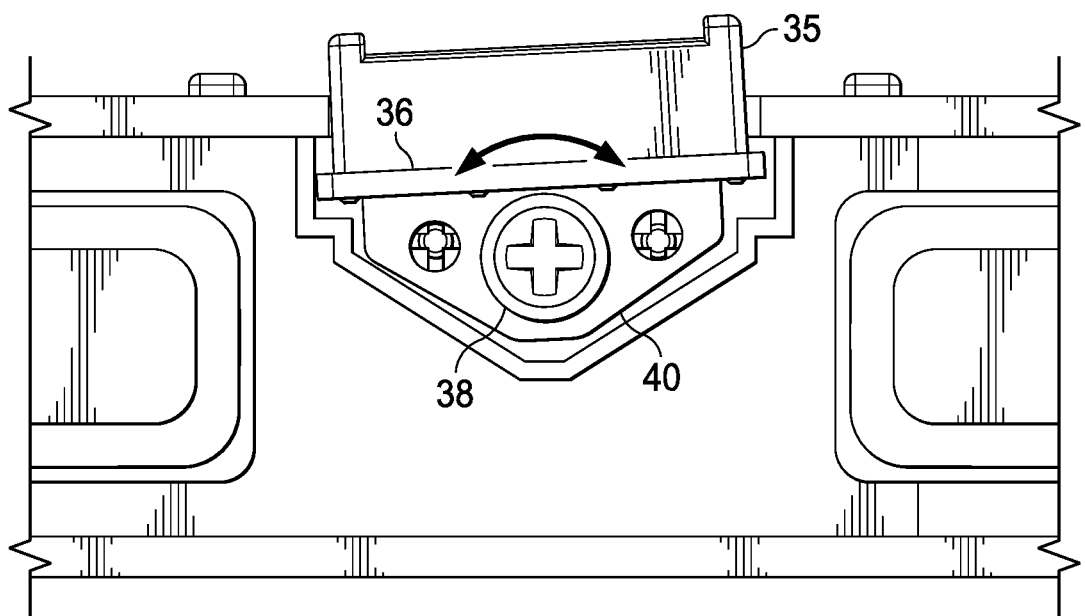

Referring now to FIGS. 9A, 9B, 9C, 9D and 9E, examples of three dimensional movement supported by an adaptive position connector to obtain a minimal gap coupling to a ferromagnetic material piece are depicted. FIG. 9A depicts dimensions of openings in magnet support 36 for a screw 38 and pins 48 that provide three dimensional movement of magnet 30. In the example embodiment, ribs disposed between adapter connector housing 40 and magnet support 36 at pins 48 and the boss of screw 38 each have a slightly larger gap on the upper side proximate magnet 30 than the lower side, as illustrated by the example dimensions. For instance, a 0.05 mm radial gap between the outer circumference of the magnet support 36 and adapter connector housing 40 defines movement available to magnet support 36. The bottom rib of the boss for screw 38 has a 0.1 mm radial gap clearance while the remaining three ribs of the boss has a 0.2 mm radial gap. These gaps provide freedom of movement about three axes as illustrated by the remaining figures. FIG. 9B depicts a side cutaway view of adaptive position connector 18 in a neutral position with the 0.2 mm gap proximate magnet 30 and 01 .mm gap distal magnet 30. FIG. 9C depicts movement of magnet support 36 upwards in response to proximity of a display ferromagnetic material piece with the lower gap reduced to zero and the upper gap increased by 0.1 mm. FIG. 9D depicts rotation about the X axis with compression of spring 34 to reduce the lower gap. FIG. 9E depicts rotation about the Y axis with movement at the gaps defined by pins 48.

Figure 10A:
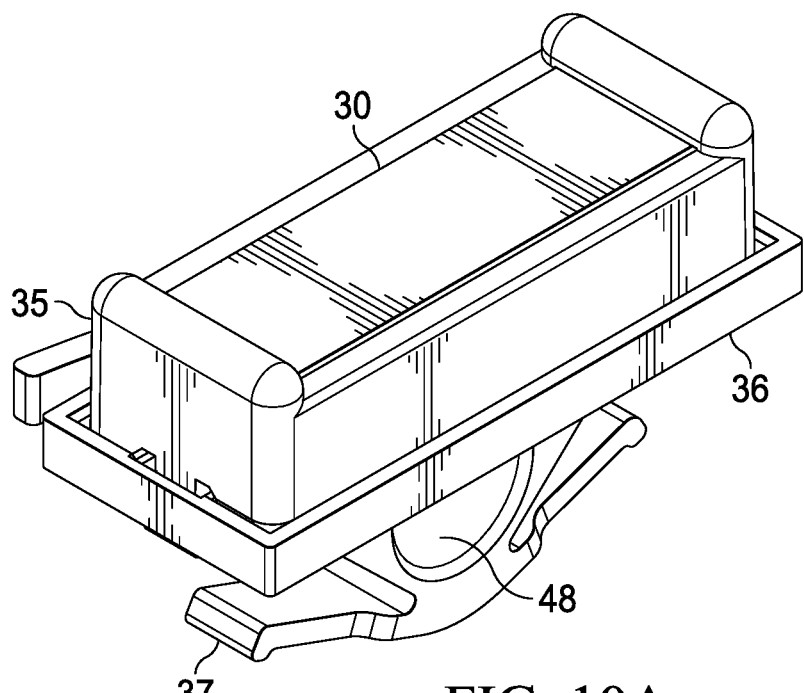
FIGS. 10A, 10B, 10C, 10D, and 10E depict another alternative embodiment that supports three dimensional movement of an adaptive position connector with side and bottom flexible members.
Figure 10B:
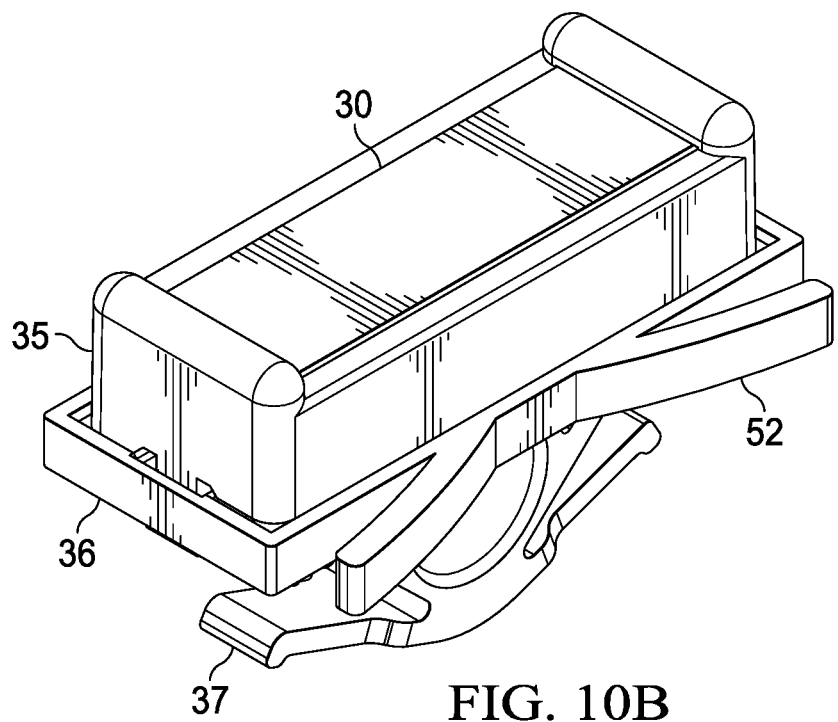
Figure 10C:
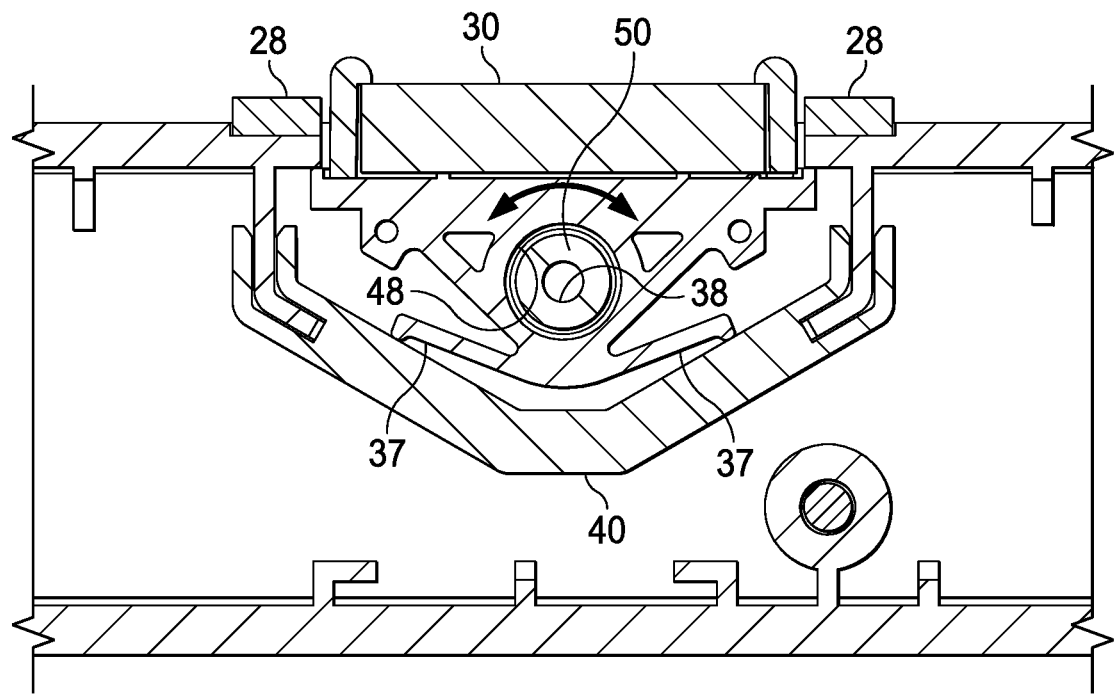
Figure 10D:
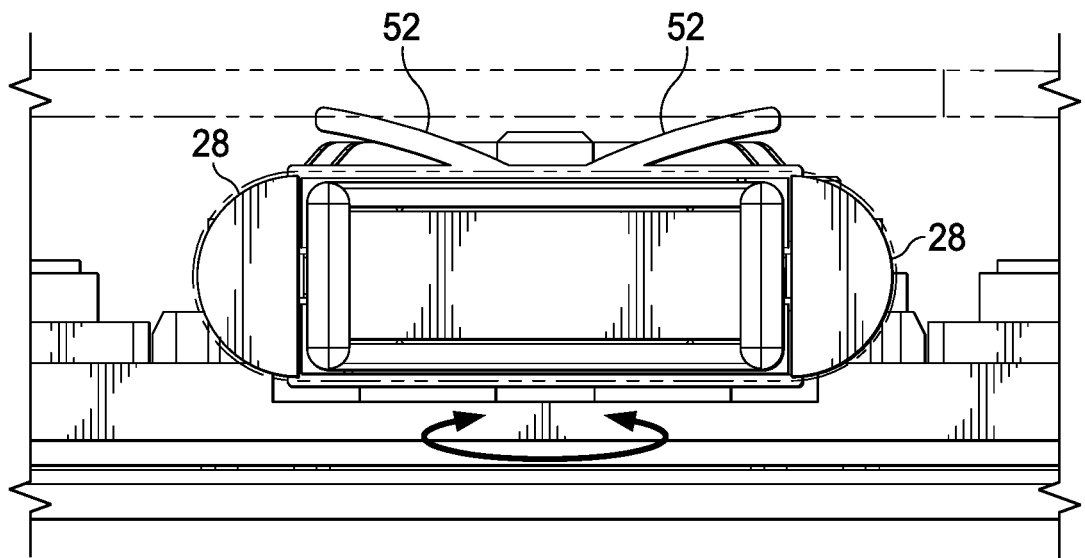
Figure 10E:
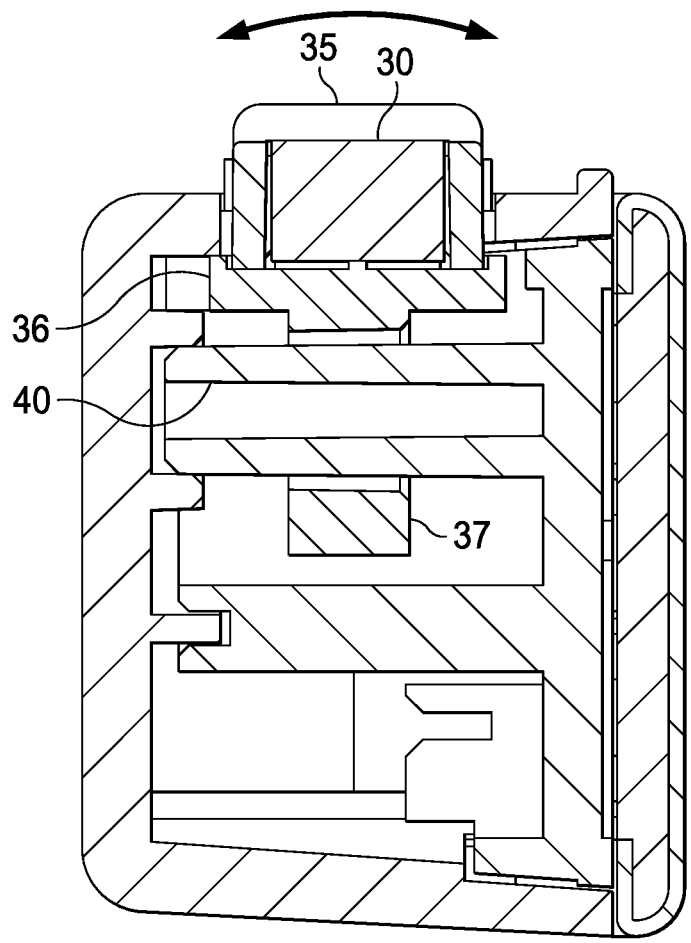

Referring now to FIGS. 10A, 10B, 10C, 10D, and 10E, another alternative embodiment is depicted that supports three-dimensional movement of an adaptive position connector 18 with side and bottom flexible members 37 and 52. FIG. 10A depicts a front isometric view of adaptive magnetic connector 18 in a having a magnet 30 secured in a housing 35 coupled to a magnet support 36 have a V-shaped bottom with flexible members 37. A screw boss opening 50 is formed in magnet support 36 to fit around a screw boss coupled to the sound bar. FIG. 10B depicts a rear isometric view of adaptive magnetic connector 18 having side flexible members 52 extending out from one side of magnet support 36 to work against the sound bar. The bottom flexible members 37 flex against the sound bar to adjust rotation of magnet 30 as depicted by the side view of FIG. 10C. Screw 38 couples to screw boss 50 around which magnet support 36 is inserted. Misalignment of magnet 30 to a ferromagnetic piece can result in rotation about screw boss 50 with flexible members 37 biasing magnet 30 towards a neutral position that is in plane with the upper surface of sound bar 12. Cushions 28 compress as magnetic attraction brings sound bar 12 coupled against a display. The side flexible members 52 provide a bias to move magnet 30 about a vertical axis, as depicted by the arrow in FIG. 10D. FIG. 10E depicts a side cutaway view of adaptive magnetic connector 18 that illustrates rotation of magnet 30 about a horizontal axis parallel to sound bar 12. A slight clearance between magnet support 36 and adapter connector housing 40 provides a constrained rocking motion as depicted by the arrow. In this manner, three-dimensional movement of magnet 30 is supported so that, at coupling to a ferromagnetic material piece, magnet 30 varies orientation relative to sound bar 12 to obtain a flat coupling orientation for optimal magnetic attraction.

Although the present invention has been described in detail, it should be understood that various changes, substitutions and alterations can be made hereto without departing from the spirit and scope of the invention as defined by the appended claims.

What is claimed is:

1. A display comprising:
    a display panel operable to present information as visual images;
    a housing coupled to the display panel and having a bottom portion disposed at a lower side of the display panel;
    first and second ferromagnetic material pieces integrated in the bottom portion at fixed locations on opposing ends of the bottom portion;
    a sound bar having speakers to present audio information;
    a first magnetic connector fixedly coupled at a first end of the sound bar to align with the first ferromagnetic material piece, the first magnetic connector having a first magnet attracted to the first ferromagnetic material, the first magnet having a static orientation relative to the sound bar; and
    a second magnetic connector adaptively coupled at a second end of the sound bar and have a second magnet attracted to the second ferromagnetic material with a dynamic orientation relative to the sound bar.

2. The display of claim 1 wherein the second magnetic connector further comprises:
    a connector housing fixedly coupled to the sound bar; and
    a magnet support adaptively coupled in the connector housing to vary orientation in three dimensions relative to the connector housing;
    wherein the second magnet fixedly couples at an exposed upper surface of the magnet support.

3. The display of claim 2 wherein the magnet support couples to the connector housing with first and second screws, the second magnetic connector further comprising first and second springs, the first spring disposed around the first screw, the second spring disposed about the second screw, the first and second springs biasing the magnet support towards a neutral position having the second magnet in plane with the first magnet.

4. The display of claim 2 wherein:
    the connector housing forms a V-shaped support surface; and
    the magnet support forms a V-shaped base configured to couple to the connector housing spaced just above the V-shaped support surface.

5. The display of claim 4 wherein the magnet support couples to the connector housing with a single screw and a spring disposed about the screw to bias the second magnet to a neutral position.

6. The display of claim 5 wherein the magnet support further comprises first and second flexible members forming the V-shape and working against the connector housing V-shaped support surface.

7. The display of claim 6 wherein the flexible members extend up from the base of the V-shaped support surface.

8. The display of claim 6 wherein the flexible members extend down towards the V-shaped support surface.

9. The display of claim 2 wherein the magnet support couples to the connector housing with a ball of the magnet support rotationally coupling into a socket of the connector housing.

10. A method for coupling a sound bar to a display bottom portion, the method comprising:
    coupling a first magnetic connector to a first end of the sound bar aligned with a first ferromagnetic material piece of the display and having a first magnet disposed in a static plane relative to the sound bar;
    coupling a second magnetic connector to a second end of the sound bar aligned with a second ferromagnetic material piece of the display and having a second magnet dynamically coupled to adjust from the static plane; and
    coupling the sound bar to the display by magnetic attraction of the first magnet to the first ferromagnetic material piece and the second magnet to the second ferromagnetic material piece, the second magnet dynamically adjusting to a co-planar orientation with the first magnet independent of the second magnet orientation relative to the sound bar.

11. The method of claim 10 further comprising:
    coupling the second magnet in a magnet support;
    coupling the magnet support to the sound bar with first and second screws inserted into first and second screw bosses; and
    managing the dynamically adjusting with first and second springs disposed around the first and second screw bosses and working against the magnet support.

12. The method of claim 11 wherein the first and second screws couple the magnet support to the sound bar at opposing ends of the magnet.

13. The method of claim 10 further comprising:
    coupling the second magnet in a magnet support having the magnet at an upper surface and a V-shape lower surface;
    coupling the magnet support to the sound bar with a single screw inserted into a screw boss; and
    managing the dynamically adjusting by interactions of the V-shape lower surface and the sound bar.

14. The method of claim 13 wherein the V-shape lower surface integrates first and second flexible members to work against the sound bar.

15. The method of claim 14 further comprising:
disposing a spring about the screw boss; and
biasing the magnet to a neutral position with the spring and the flexible members.

16. The method of claim 10 further comprising:
coupling the second magnet in a magnet support having the magnet at an upper surface and a ball at a lower surface;
coupling the magnet support to the sound bar by inserting the ball into a cup; and
managing the dynamically adjusting by rotating the ball in the cup.

17. A display sound bar attachment device comprising:
a fixed position connector having a first magnet coupled to the sound bar in a plane and having a static orientation relative to the sound bar; and
an adaptive connector having a second magnet coupled to the sound bar in the plane and having a dynamic orientation relative to the sound bar and the plane.

18. The display sound bar attachment device of claim 17 wherein the adaptive connector further comprises:
first and second screws coupled to the sound bar at opposing sides of the magnet through screw bosses; and
first and second springs disposed about the screw bosses to bias the adaptive connector to a neutral position relative to the plane.

19. The display sound bar attachment device of claim 17 wherein the adaptive connector further comprises:
a screw coupled to the sound bar through a screw boss; and
first and second flexible members extending from the flexible member to work against the sound bar and bias the adaptive connector to a neutral position relative to the plane.

20. The display sound bar attachment device of claim 17 wherein the adaptive connector further comprises:
a ball coupled to the second magnet; and
a socket fixed relative to the sound bar, the ball coupled to the socket to adapt an orientation of the magnet relative to the sound bar.

* * * * *